(12) United States Patent
Adachi

(10) Patent No.: US 10,575,405 B2
(45) Date of Patent: Feb. 25, 2020

(54) MODULE

(71) Applicant: Murata Manufacturing Co., Ltd., Kyoto (JP)

(72) Inventor: Toshiro Adachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/669,187

(22) Filed: Aug. 4, 2017

(65) Prior Publication Data

US 2017/0339791 A1    Nov. 23, 2017

Related U.S. Application Data

(63) Continuation of application No. PCT/JP2016/050459, filed on Jan. 8, 2016.

(30) Foreign Application Priority Data

Feb. 6, 2015    (JP) ................. 2015-021776

(51) Int. Cl.
*H01F 17/00* (2006.01)
*H01F 27/28* (2006.01)
(Continued)

(52) U.S. Cl.
CPC ......... *H05K 1/182* (2013.01); *H01F 17/0033* (2013.01); *H01F 17/062* (2013.01);
(Continued)

(58) Field of Classification Search
CPC ............. H01F 17/0033; H01F 27/2804; H01F 27/2895; H05K 1/182; H05K 1/165; H05K 1/181
(Continued)

(56) References Cited

U.S. PATENT DOCUMENTS

| | | | |
|---|---|---|---|
| 5,959,846 A | 9/1999 | Noguchi | |
| 2005/0212642 A1* | 9/2005 | Pleskach | H01F 17/0033 336/200 |
| 2009/0002111 A1 | 1/2009 | Harrison | |

FOREIGN PATENT DOCUMENTS

| | | |
|---|---|---|
| JP | H10-242339 A | 9/1998 |
| JP | 2005-026249 A | 1/2005 |

(Continued)

OTHER PUBLICATIONS

International Search Report issued in Application No. PCT/JP2016/050459 dated Mar. 1, 2016.
(Continued)

*Primary Examiner* — Jenny L Wagner
*Assistant Examiner* — Arun Ramaswamy
(74) *Attorney, Agent, or Firm* — Pearne & Gordon LLP

(57) ABSTRACT

A module includes a wiring board, an insulating layer that is laminated on the bottom surface of the wiring board, a ring-shaped coil core that is embedded in the insulating layer, a coil electrode that is wound around the coil core, electronic components that are disposed in an inner region surrounded by the coil core in the insulating layer, and an electronic component that is mounted on or in the top surface of the wiring board. With this configuration, the areas of main surfaces of the wiring board and main surfaces of the insulating layer are not large, whereas if the electronic components were mounted on or in the top surface of the wiring board, the areas of the main surfaces of the wiring board and the main surfaces of the insulating layer would be large, and a reduction in the size of the module can be facilitated.

6 Claims, 4 Drawing Sheets

(51) Int. Cl.
*H05K 1/18* (2006.01)
*H05K 1/16* (2006.01)
*H01F 17/06* (2006.01)
*H01F 27/06* (2006.01)

(52) U.S. Cl.
CPC ..... *H01F 27/2804* (2013.01); *H01F 27/2895* (2013.01); *H05K 1/165* (2013.01); *H05K 1/185* (2013.01); *H01F 2017/0086* (2013.01); *H01F 2027/065* (2013.01); *H01F 2027/2809* (2013.01); *H05K 2201/086* (2013.01); *H05K 2201/10015* (2013.01)

(58) Field of Classification Search
USPC ........... 29/602.1; 336/96, 229, 69, 192, 200; 361/762, 782; 363/17
See application file for complete search history.

(56) References Cited

FOREIGN PATENT DOCUMENTS

| | | |
|---|---|---|
| JP | 2010-516056 A | 5/2010 |
| JP | 2013-207149 A | 10/2013 |

OTHER PUBLICATIONS

Written Opinion issued in Application No. PCT/JP2016/050459 dated Mar. 1, 2016.

\* cited by examiner

MODULE

This is a continuation of International Application No. PCT/JP2016/050459 filed on Jan. 8, 2016 which claims priority from Japanese Patent Application No. 2015-021776 filed on Feb. 6, 2015. The contents of these applications are incorporated herein by reference in their entireties.

BACKGROUND

Technical Field

The present disclosure relates to a module that includes a coil and an electronic component, and more particularly to a module that includes a wiring board, an insulating layer in which a coil core is embedded, a coil electrode that is wound around the coil core, and an electronic component that is mounted on or in the wiring board.

In an electronic device that uses a high-frequency signal, for example, a toroidal coil may sometimes be used as a component for suppressing noise. Since a toroidal coil is relatively large compared with other electronic components that are mounted on or in a wiring board, there is a problem in that a large area of the wiring board is occupied as a mounting region of the toroidal coil. In addition, there is another problem in that, as a result of mounting such a large toroidal coil on or in a wiring board, it becomes difficult to reduce the overall height of a module.

Accordingly, in the related art, there has been proposed a technology for facilitating a reduction in the size of a module by embedding a toroidal coil in a wiring board. For example, as illustrated in FIG. 6, a module 200 described in Patent Document 1 includes a wiring board 201 that is formed of a plurality of insulating layers laminated together, a ring-shaped coil core 202 that is embedded in the wiring board 201, and a coil electrode 203 that is helically wound around the coil core 202.

The coil electrode 203 includes a plurality of upper wiring patterns 203a that are formed on or in one of the insulating layers, the insulating layer being located above the coil core 202, a plurality of lower wiring patterns 203b that are formed on or in one of the insulating layers, the insulating layer being located below the coil core 202, and a plurality of interlayer connection conductors 204 each of which connects one of the upper wiring patterns 203a and a corresponding one of the lower wiring patterns 203b to each other. In addition, end portions of the coil electrode 203 are connected to extended wiring lines 205 and are capable of being connected to the outside by, for example, input/output pad electrodes that are provided at positions where the extended wiring lines 205 are extended to. In this case, the upper wiring patterns 203a, the lower wiring patterns 203b, and the extended wiring lines 205 are each formed by, for example, etching a Cu foil. The interlayer connection conductors 204 are formed by plating via holes formed in the insulating layers. As described above, by embedding the coil core 202 and the coil electrode 203 in the wiring board 201, a reduction in the area of a main surface of the wiring board 201 and a reduction in the overall height of the module 200 can be facilitated while mounting areas of components are ensured.

Patent Document 1: Japanese Unexamined Patent Application Publication No. 2013-207149 (See [0015] to [0021], FIG. 1, and the like)

BRIEF SUMMARY

With the recent reduction in the sizes of electronic devices, there has been a demand for a further reduction in the sizes of modules that are installed in the electronic devices. However, in the module 200 of the related art, although reductions in the size and height of the module 200 can be facilitated by embedding a toroidal coil in the wiring board 201, studies have not been conducted on a further reduction in the size of the module 200 by taking into consideration the positional relationship between other electronic components, which are to be mounted on or in the wiring board 201, and the toroidal coil.

The present disclosure has been made in view of the above problem, and the present disclosure facilitates a reduction in the size of a module that includes a coil and an electronic component.

A module according to the present disclosure includes a wiring board, an insulating layer that is laminated on a first main surface of the wiring board, a coil core that is embedded in the insulating layer so as to surround a predetermined region, a coil electrode that is wound around the coil core, and a first electronic component that is disposed in the predetermined region of the insulating layer.

With this configuration, since the first electronic component is disposed in the predetermined region surrounded by the coil core in the insulating layer, the areas of the main surfaces of the wiring board and main surfaces of the insulating layer are not large, whereas if the first electronic component was disposed in a region outside the coil core in the insulating layer, the areas of the main surfaces of the wiring board and the main surfaces of the insulating layer would be large, and a reduction in the size of the module can be facilitated. In addition, since the first electronic component is disposed in the insulating layer, a reduction in the height of the module can be facilitated.

The module may further include a second electronic component that is mounted on or in a second main surface of the wiring board. In addition, the first electronic component may be mounted on or in the first main surface of the wiring board, and a height of the first electronic component from the first main surface of the wiring board may be larger than a height of the second electronic component from the second main surface of the wiring board and may not be larger than a height of the coil core from the first main surface of the wiring board.

In the case where an electronic component is mounted on or in the second main surface of the wiring board, the height of the electronic component (from the second main surface) affects the thickness of the module. Here, the thickness of the module in the case where a plurality of electronic components are mounted on or in the second main surface of the wiring board increases depending on the electronic component having the largest height among the electronic components. Accordingly, a reduction in the height of the module can be facilitated by disposing the electronic component (first electronic component), whose height from the main surface of the wiring board is the largest, in the region (predetermined region) surrounded by the coil core in the insulating layer.

The coil core may be formed in a ring-like shape. In this case, reductions in the size and height of the module, which includes the coil core formed in a ring-like shape, can be facilitated.

The coil core may be formed in a partially cut-away ring-like shape. In this case, reductions in the size and height of the module, which includes the coil core formed in a partially cut-away ring-like shape, can be facilitated.

The coil electrode may include a plurality of first wiring patterns each of which has a first end and a second end that are respectively located on an inner side of the coil core and on an outer side of the coil core, the plurality of first wiring patterns being arranged along a winding axis direction of the coil electrode on a first main surface of the insulating layer, which is the main surface located on a side opposite to a side on which the wiring board is disposed, a plurality of second wiring patterns each of which has a first end and a second end that are respectively located on the inner side of the coil core and on the outer side of the coil core, the plurality of second wiring patterns being arranged, so as to be paired with the first wiring patterns, along the winding axis direction of the coil electrode on a second main surface of the insulating layer, which is the main surface located on the side on which the wiring board is disposed, a plurality of inner conductors that are disposed on the inner side of the coil core and each of which connects the first end of one of the first wiring patterns and the first end of one of the second wiring patterns, the second wiring pattern being paired with the first wiring pattern, and a plurality of outer conductors that are disposed on the outer side of the coil core and each of which connects the second end of one of the first wiring patterns and the second end of one of the second wiring patterns, the second wiring pattern being next to the second wiring pattern that is paired with the first wiring pattern. In addition, the inner conductors and the outer conductors may each be formed of a metallic pin.

In the case where the inner and outer conductors are formed of via conductors or through hole conductors, which require formation of through holes, in order to form independent through holes, there need to be predetermined gaps between adjacent ones of the conductors, and thus, there is a limitation with regard to increasing the number of turns of a coil by reducing the gaps between adjacent ones of the conductors. In the case of using metallic pins, which are provided without necessarily forming through holes, the gaps between adjacent ones of the metallic pins may be easily reduced. Thus, as a result of the inner and outer conductors being formed of metallic pins, the number of turns of the coil electrode can be increased, so that an improvement in coil characteristics (the inductance of the coil) can be facilitated.

Since a metallic pin has a specific resistance lower than that of a through hole conductor or a via conductor which is formed by filling a via hole with an electrically conductive paste, the resistance of the entire coil electrode can be reduced. Therefore, a coil component having good coil characteristics including, for example, Q value can be provided.

According to the present disclosure, a first electronic component is disposed in a predetermined region surrounded by a coil core in an insulating layer, and thus, the areas of main surfaces of a wiring board and main surfaces of an insulating layer are not large, whereas if the first electronic component was disposed in a region outside the coil core in the insulating layer, the areas of the main surfaces of the wiring board and the main surfaces of the insulating layer would be large, and a reduction in the size of a module can be facilitated. In addition, since the first electronic component is disposed in the insulating layer, a reduction in the height of the module can be facilitated.

DETAILED DESCRIPTION

Embodiments

Figure 1:
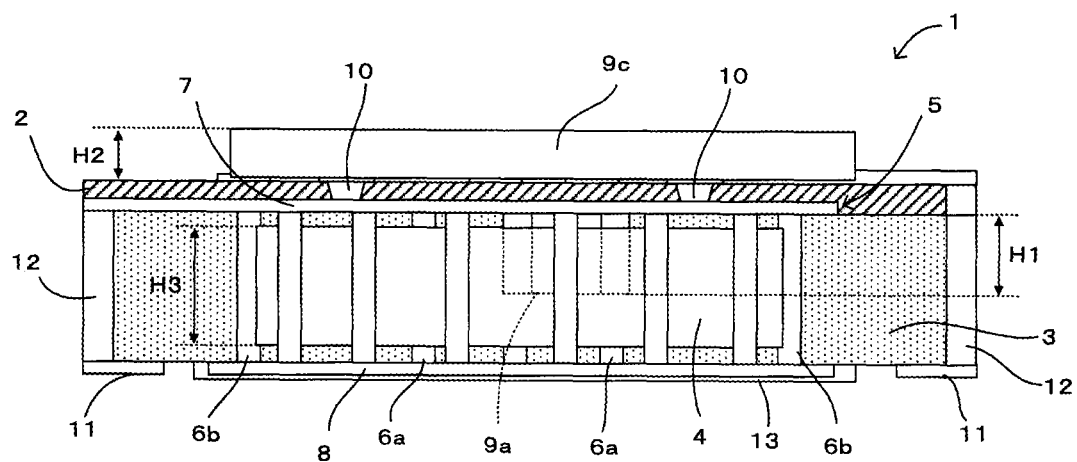
FIG. 1 is a partial cross-sectional view of a module according to an embodiment of the present disclosure.
Figure 2:
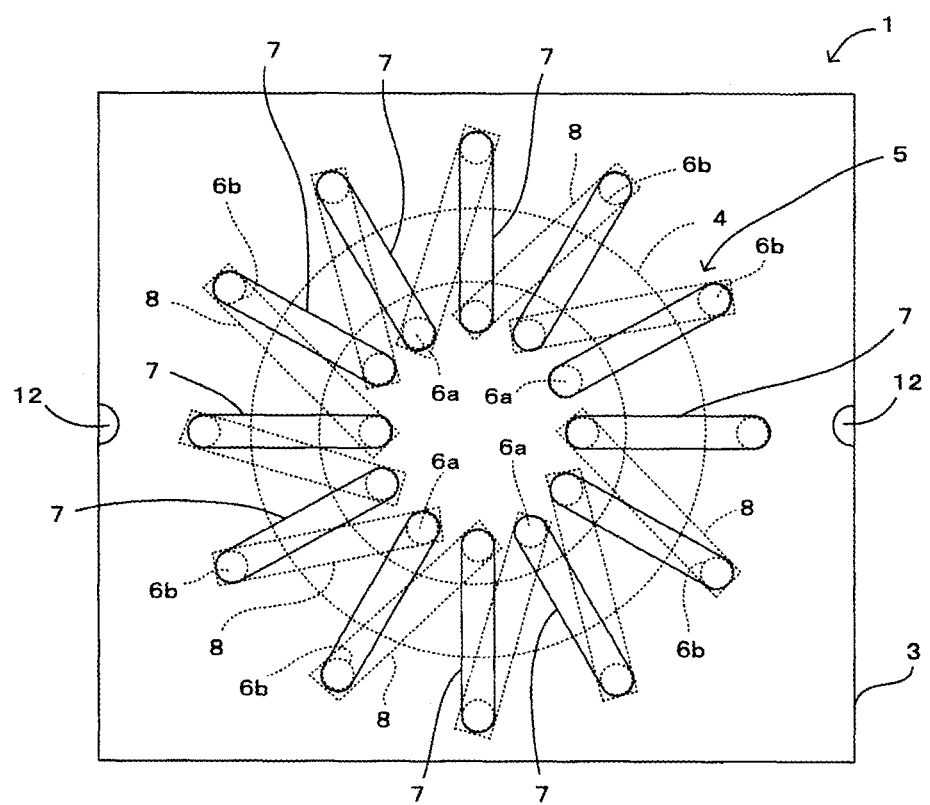
FIG. 2 is a diagram illustrating a coil electrode illustrated in FIG. 1.
Figure 3:
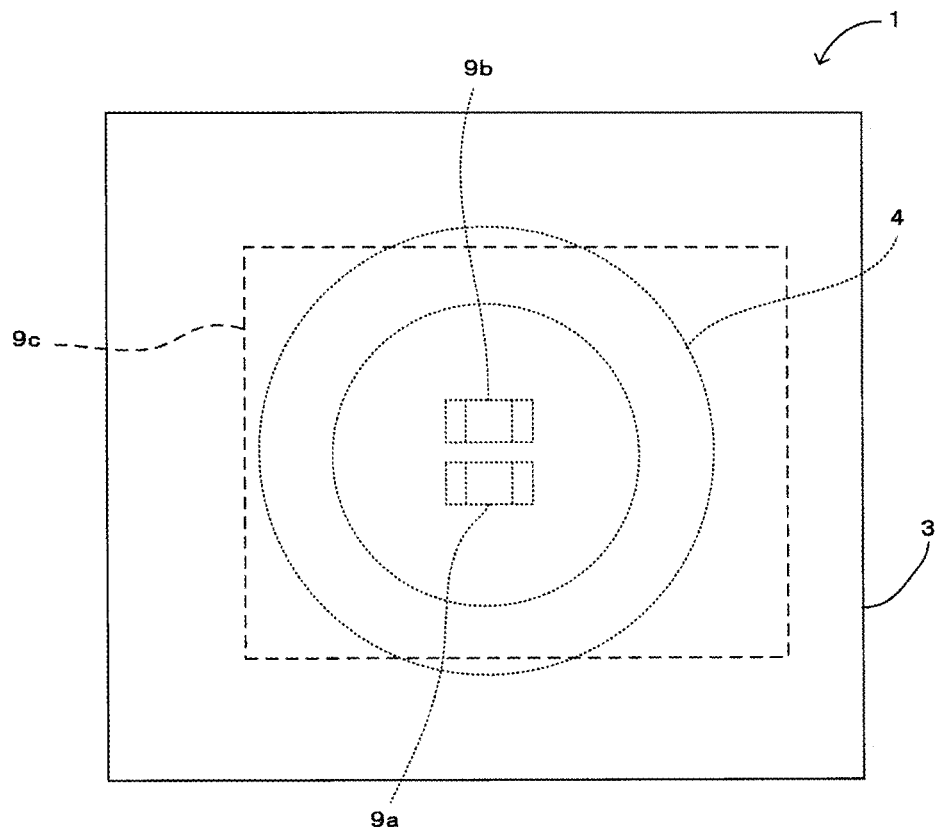
FIG. 3 is a diagram illustrating the positional relationship between electronic components illustrated in FIG. 1.
Figure 4:
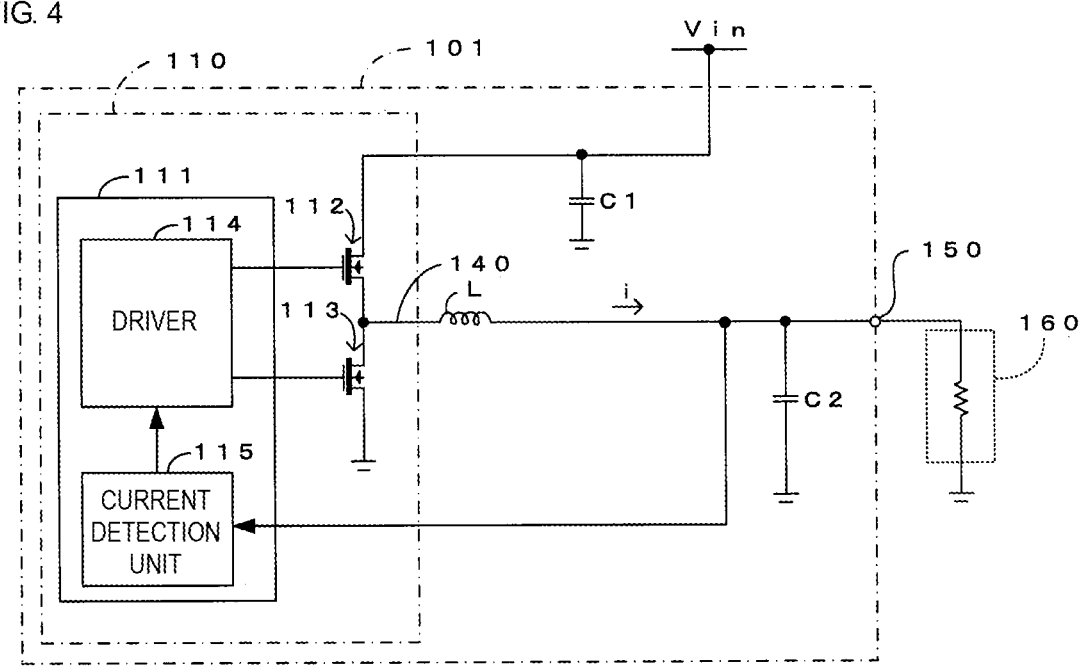
FIG. 4 is a diagram illustrating an example of a power supply circuit including the module illustrated in FIG. 1.

A module according to an embodiment of the present disclosure will now be described with reference to FIG. 1 to FIG. 4. FIG. 1 is a partial cross-sectional view of the module. FIG. 2 is a plan view of the module illustrating a coil electrode. FIG. 3 is a plan view of the module illustrating the positional relationship between electronic components. FIG. 4 is a diagram illustrating an example of a power supply circuit including the module. In FIG. 2 and FIG. 3, only components that are necessary for the following description are illustrated, and the other components are not illustrated.

As illustrated in FIG. 1 to FIG. 3, a module 1 according to the present embodiment forms a DC-DC converter and includes a wiring board 2, an insulating layer 3 that is laminated on the bottom surface of the wiring board 2 (corresponding to "a first main surface of a wiring board" according to the present disclosure), a coil core 4 that is embedded in the insulating layer 3, a coil electrode 5 that is wound around the coil core 4, two electronic components 9a and 9b that are disposed in the insulating layer 3, and an electronic component 9c that is mounted on the top surface of the wiring board 2.

For example, the wiring board 2 is made of a glass epoxy resin or the like. Various wiring electrodes, a plurality of mount electrodes for the electronic components 9a to 9c, via conductors 10, and the like are formed on the main surfaces of the wiring board 2 or in the wiring board 2. Note that, in the present embodiment, a plurality of upper wiring patterns 7 that form part of the coil electrode 5 are formed on or in the bottom surface of the wiring board 2, so that the upper wiring patterns 7 are positioned at the top surface of the insulating layer 3.

For example, the insulating layer 3 is made of a resin, such as an epoxy resin, and formed so as to have a predetermined thickness and to cover the coil core 4 and a plurality of metallic pins 6a and 6b, which will be described later. Note that, in the present embodiment, the main surfaces (top surface and bottom surface) of the wiring board 2 and the main surfaces (top surface and bottom surface) of the insulating layer 3 are each formed in a rectangular shape.

The coil core 4 is formed of a magnetic member, which is made of Mn—Zn ferrite or the like and employed as a common coil core. In addition, as illustrated in FIG. 2, the coil core 4 has a shape surrounding a predetermined region of the insulating layer 3 when viewed in plan view. More specifically, the coil core 4 according to the present embodiment is formed in a ring-like shape, and a region inside the ring-like shape corresponds to the predetermined region. Note that the shape of the coil core 4 is not limited to a ring-like shape, and for example, the coil core 4 may be formed in a polygonal shape or an elliptical loop shape.

As illustrated in FIG. 2, the coil electrode 5 is helically wound around the coil core 4 and includes a plurality of lower wiring patterns 8 that are arranged along a winding axis direction of the coil electrode 5 on the bottom surface of the insulating layer 3, the bottom surface being the main surface located on the side opposite to the side on which the wiring board 2 is disposed, the plurality of upper wiring patterns 7 that are arranged along the winding axis direction on the top surface of the insulating layer 3 so as to be paired with the lower wiring patterns 8, and a plurality of inner metallic pins 6a and a plurality of outer metallic pins 6b each of which connects one of the upper wiring patterns 7 and a corresponding one of the lower wiring patterns 8. The winding axis direction may be a direction parallel to the main surface of the insulating layer 3. The winding axis may have a ring shape, a substantially square shape, a partially cut-away ring shape, or a partially cut-away substantially square shape.

The upper wiring patterns 7 are arranged along the winding axis direction of the coil electrode 5 (the circumferential direction of the coil core 4 or the extending direction of magnetic flux lines that are generated when a current is applied to the coil electrode 5) in a state where a first end and a second end of each of the upper wiring patterns 7 are respectively located on the inner side (the inner periphery side) of the coil core 4 and on the outer side (the outer periphery side) of the coil core 4 when viewed in a direction perpendicular to the bottom surface of the insulating layer 3. Similar to the upper wiring patterns 7, the lower wiring patterns 8 are arranged along the winding axis direction of the coil electrode 5 in a state where a first end and a second end of each of the lower wiring patterns 8 are respectively located on the inner side of the coil core 4 and on the outer side of the coil core 4.

In the present embodiment, each of the upper and lower wiring patterns 7 and 8 is formed so as to have a two-layer structure formed of a base electrode, which is formed by screen printing using an electrically conductive paste containing a metal, such as Cu or Ag, and a surface electrode, which is formed by, for example, Cu plating so as to be laminated on the base electrode. Note that each of the upper and lower wiring patterns 7 and 8 may have a single-layer structure. In this case, similar to the base electrode, each of the upper and lower wiring patterns 7 and 8 can be formed by screen printing using an electrically conductive paste containing a metal, such as Cu or Ag. Here, the above-mentioned lower wiring patterns 8 correspond to "first wiring patterns" according to the present disclosure, and the upper wiring patterns 7 correspond to "second wiring patterns" according to the present disclosure.

Each of the inner metallic pins 6a connects the first end of one of the lower wiring patterns 8 and the first end of one of the upper wiring patterns 7, the upper wiring pattern 7 being paired with the lower wiring pattern 8, to each other. The inner metallic pins 6a are arranged along the inner peripheral surface of the coil core 4 while being vertically arranged in the thickness direction of the insulating layer 3.

Each of the outer metallic pins 6b connects the second end of one of the lower wiring patterns 8 and the second end of one of the upper wiring patterns 7 that is next to, on a predetermined side (in a clockwise direction in the present embodiment), the upper wiring pattern 7 that is paired with the lower wiring pattern 8. The outer metallic pins 6b are arranged along the outer peripheral surface of the coil core 4 while being vertically arranged in the thickness direction of the insulating layer 3. Here, the inner metallic pins 6a correspond to "inner conductors" according to the present disclosure, and the outer metallic pins 6b correspond to "outer conductors" according to the present disclosure.

The upper end surfaces of the inner metallic pins 6a and the upper end surfaces of the outer metallic pins 6b are exposed at the top surface of the insulating layer 3, and the lower end surfaces of the inner metallic pins 6a and the lower end surfaces of the outer metallic pins 6b are exposed at the bottom surface of the insulating layer 3. Each of the metallic pins 6a and 6b is formed of a metallic member, which is made of, for example, Cu, Au, Ag, Al, or a Cu-based alloy and generally employed as a wiring electrode. In addition, in the present embodiment, the metallic pins 6a and 6b are each formed in a columnar shape so as to have approximately the same thickness and length. In this manner, the upper and lower wiring patterns 7 and 8 and the inner and outer metallic pins 6a and 6b form the coil electrode 5, which is helically wound around the coil core 4.

Note that, in the present embodiment, although the inner and outer metallic pins 6a and 6b are each formed in a columnar shape, the inner and outer metallic pins 6a and 6b may each be formed in, for example, a rectangular columnar shape or the like. Alternatively, components that correspond to the inner and outer metallic pins 6a and 6b may be formed by using columnar conductors, such as via conductors.

Outer electrodes 11 for external connection are formed on or in the bottom surface of the insulating layer 3, so that the module 1 can be connected to, for example, a mother substrate of an electronic device. Here, the outer electrodes 11 are connected to the lower end surfaces of metallic pins 12 for external connection. Each of the metallic pins 12 is disposed in the insulating layer 3 such that a portion thereof (a portion of a peripheral side surface thereof) is exposed at a side surface of the module 1, and the module 1 can be connected to the outside by the outer electrodes 11 and the portions of the peripheral side surfaces of the metallic pins 12, which are exposed at the side surface of the module 1.

An insulating coating film 13 that protects wiring electrodes (e.g., the lower wiring patterns 8 and the like) excluding the outer electrodes 11 is formed on or in the bottom surface of the insulating layer 3. For example, the insulating coating film 13 may be made of an insulating material, such as a polyimide resin or an epoxy resin.

In the present embodiment, the electronic component 9c, which is mounted on or in the top surface of the wiring board 2 (corresponding to "a second main surface of the wiring board" according to the present disclosure), is a control IC of the DC-DC converter and is disposed such that an active surface thereof faces the top surface of the wiring board 2 (so-called flip chip mounting). Each of the two electronic components 9a and 9b, which are disposed in the insulating layer 3, is formed of a chip capacitor and mounted on or in the bottom surface of the wiring board 2.

Note that since the electronic component 9c, which is mounted on or in the top surface of the wiring board 2, is mounted by so-called face-down mounting, the characteristics of the electronic component 9c as a component can be maintained even if the top surface of the electronic component 9c is, for example, ground. Thus, with this configuration, a further reduction in the height of the module 1 can be facilitated by, for example, grinding the top surface of the electronic component 9c. Here, each of the electronic components 9a and 9b, which are mounted on or in the bottom surface of the wiring board 2, corresponds to "a first electronic component" according to the present disclosure, and the electronic component 9c, which is mounted on or in the top surface of the wiring board 2, corresponds to "a second electronic component" according to the present disclosure.

In the present embodiment, reductions in the size and height of the module 1 are facilitated by devising a way of arranging the coil core 4 and the electronic components 9a to 9c as described above. To describe it specifically, as illustrated in FIG. 3, the electronic component 9c, which is mounted on or in the top surface of the wiring board 2, is disposed so as to be superposed with the coil core 4 when viewed in plan view. In contrast, the electronic components 9a and 9b, which are disposed in the insulating layer 3, are disposed in a region that is superposed with the electronic component 9c and surrounded by the coil core 4 (corresponding to "a predetermined region" according to the present disclosure) when the inside of the insulating layer 3 is viewed in plan view. In other words, each of the electronic components 9a and 9b is disposed in an empty space of the inner region surrounded by the coil core 4.

As illustrated in FIG. 1, in the present embodiment, in a state where the electronic components 9a and 9b, which are disposed in the insulating layer 3, are in a mounted state, the heights of the electronic components 9a and 9b from the bottom surface of the wiring board 2 are substantially the same, that is, a height H1. Regarding the electronic component 9c located on the top surface side of the wiring board 2, in a state where the electronic component 9c is in a mounted state, a height H2 of the electronic component 9c from the top surface of the wiring board 2 is smaller than the height H1 of each of the electronic components 9a and 9b (H1>H2). In addition, the height H1 of each of the electronic components 9a and 9b is not larger than the height of the coil core 4 from the bottom surface of the wiring board 2. By arranging the electronic components 9a to 9c in this manner, the height of the module 1 can be reduced. In other words, in the case where a thickness H3 of the coil core 4 or the height of the coil core 4 from the bottom surface of the wiring board 2 is larger than any of the heights (e.g., H1 and H2) of the electronic components 9a to 9c in the mounted state, at least one electronic component among the electronic components 9a to 9c having a height (chip thickness) larger than the height of each of the other electronic components can be disposed in the insulating layer 3 in order to facilitate a reduction in the height of the module 1.

Note that the positional relationship between the electronic components 9a to 9c and the coil core 4 may be suitably changed. For example, one of the two electronic components 9a and 9b, which are mounted on or in the bottom surface of the wiring board 2, may be mounted on or in the top surface of the wiring board 2. Alternatively, the one of the electronic components 9a and 9b may be mounted on the outer periphery side of the coil core 4 when viewed in plan view while both the electronic components 9a and 9b are mounted on or in the bottom surface of the wiring board 2. That is to say, the electronic component to be disposed on the inner periphery side of the coil core 4 may be suitably selected in accordance with the size of an empty space of the inner region surrounded by the coil core 4, and the arrangement of the rest of the electronic components 9a to 9c may be suitably changed in response to the above selection. In addition, for example, another electronic component that is different from the electronic components 9a to 9c may be mounted in an empty region of the top surface or the bottom surface of the wiring board 2.

(Power Supply Circuit)

An example of a circuit including the module according to the present embodiment will now be described with reference to FIG. 4. FIG. 4 is a diagram illustrating an example of a power supply circuit including the module.

A power supply circuit 101 forms a common step-down DC-DC converter and supplies direct-current power to a load 160. The power supply circuit 101 includes a power supply unit 110, an inductor L (choke coil) that is inserted in series into a power supply path 140, and input and output capacitors C1 and C2 each of which is shunt-connected between the power supply path 140 and a ground.

The power supply unit 110 is formed of an IC in which a circuit element used for forming the DC-DC converter is formed and includes a control circuit 111 and switching elements 112 and 113 each of which is formed of, for example, a MOSFET. The power supply unit 110 is connected to an external direct-current power supply Vin via the input capacitor C1. The control circuit 111 includes a driver 114 that switches on and off the switching elements 112 and 113 by performing PWM driving and a current detection unit 115 that detects a load supply current i supplied to the load 160.

The current detection unit 115 is formed of a common differential amplifier or the like. The driver 114 performs control for switching on and off the switching elements 112 and 113 on the basis of a detection signal of the current detection unit 115. Then, the power supply unit 110 performs feedback control based on the detection signal of the current detection unit 115, and as a result, the direct-current power is supplied to the load 160 via the power supply path 140 and an output terminal 150.

More specifically, once power supply to the load 160 has been started, first, the driver 114 switches on the switching element 112 and switches off the switching element 113, and as a result, the load supply current i supplied to the load 160 from the direct-current power supply Vin is increased. Then, the voltage detected by the current detection unit 115 increases with an increase in the load supply current i, and when the detected voltage becomes larger than a predetermined value, the driver 114 switches off the switching element 112 and switches on the switching element 113.

When the switching elements 112 and 113 are switched on or off by the driver 114, discharging of the output capacitor C2, which has been charged, is started, and the load supply current i is decreased. Then, the voltage detected by the current detection unit 115 decreases with a decrease in the load supply current i, and when the detected value becomes smaller than the predetermined value, the driver 114 switches on the switching element 112 and switches off the switching element 113.

Note that the above-mentioned inductor L is formed of a coil that includes the coil core 4 and the coil electrode 5, which are included in the module 1, and the input and output capacitors C1 and C2 are formed of the two electronic components 9a and 9b, which are disposed in the inner region surrounded by the coil core 4. Although the power supply circuit 101 (power supply unit 110) has been described by taking a common step-down DC-DC converter as an example, the configuration of the power supply circuit 101 may be any commonly known configuration, and since the detailed configurations and operations of the driver 114 and the current detection unit 115 are commonly known, other detailed descriptions will be omitted.

(Method of Manufacturing Module)

An example of a method of manufacturing the module 1 will now be briefly described. First, the wiring board 2 is prepared. The plurality of mount electrodes for the electronic components 9a to 9c, the via conductors 10, and various wiring electrodes have been formed at predetermined positions on or in the two main surfaces of the wiring board 2, and the plurality of upper wiring patterns 7 forming part of the coil electrode 5 have been formed on or in one of the main surfaces of the wiring board 2, the main surface corresponding to the bottom surface of the wiring board 2.

Next, first ends of the inner and outer metallic pins 6a and 6b and first ends of the metallic pins 12 for external connection are connected to predetermined positions on the upper wiring patterns 7, which are located at the bottom surface of the wiring board 2, with solder or the like. At the same time, the electronic components 9a and 9b are mounted on an inner region surrounded by the inner metallic pins 6a with solder or the like. In this case, the metallic pins 6a, 6b, and 12 and the electronic components 9a and 9b are mounted while the wiring board 2 is placed such that the bottom surface thereof faces upward.

Subsequently, the coil core 4 is placed at a predetermined position on or in the bottom surface of the wiring board 2, and the bottom surface of the wiring board 2 is coated with a resin such that the resin covers the metallic pins 6a, 6b, and 12 and the coil core 4 (formation of the insulating layer 3). For example, an epoxy resin can be used as the resin.

Then, the bottom surface of the insulating layer 3 is polished or ground until second ends of the metallic pins 6a, 6b, and 12 are exposed.

Next, the lower wiring patterns 8 and the outer electrodes 11 are formed on or in the bottom surface of the insulating layer 3. As described above, each of the lower wiring patterns 8 and the outer electrodes 11 can be formed by, for example, forming a base electrode by screen printing using an electrically conductive paste containing Cu or the like and then forming a surface electrode by Cu plating on the base electrode.

After that, the insulating coating film 13 is formed on or in the bottom surface of the insulating layer 3 by screen printing or the like. The insulating coating film 13 can be made of, for example, a polyimide or an epoxy resin.

Finally, manufacture of the module 1 is completed by mounting the electronic component 9c on or in the top surface of the wiring board 2. Note that an additional resin layer that seals the electronic component 9c may be provided on or in the top surface of the wiring board 2.

According to the above-described embodiment, the electronic components 9a and 9b are mounted on or in the bottom surface of the wiring board 2 and also disposed in the inner region surrounded by the coil core 4 in the insulating layer 3, and thus, the areas of the main surfaces of the wiring board 2 and the main surfaces of the insulating layer 3 are not large, whereas if the electronic components 9a and 9b were placed in a region outside the coil core 4, the areas of the main surfaces of the wiring board 2 and the main surfaces of the insulating layer 3 would be large, and a reduction in the size of the module 1 can be facilitated.

In addition, since the height H1 of each of the electronic components 9a and 9b, which are mounted on or in the bottom surface of the wiring board 2, from the bottom surface of the wiring board 2 is larger than the height H2 of the electronic component 9c, which is mounted on or in the top surface of the wiring board 2, from the top surface of the wiring board 2, a reduction in the height of the module 1 can be facilitated, whereas if all the electronic components 9a to 9c were mounted on or in the top surface of the wiring board 2, a reduction in the height of the module 1 would not be facilitated.

In the case of using via conductors or through hole conductors, which require formation of through holes, instead of the metallic pins 6a and 6b, in order to form independent through holes, there need to be predetermined gaps between adjacent ones of the conductors, and thus, there is a limitation with regard to increasing the number of turns of a coil electrode by reducing the gaps between adjacent ones of the conductors. As in the present embodiment, in the case of using the metallic pins 6a and 6b, which are provided without necessarily forming through holes, the gaps between adjacent ones of the metallic pins 6a and 6b may be easily reduced, and thus, an improvement in coil characteristics (the inductance of a coil) can be facilitated by increasing the number of turns of the coil electrode 5.

In addition, since each of the metallic pins 6a and 6b has a specific resistance lower than that of a through hole conductor or a via conductor which is formed by filling a via hole with an electrically conductive paste, the resistance of the entire coil electrode 5 can be reduced. Therefore, the module 1 having good coil characteristics including, for example, Q value can be provided.

(Modification of Coil Core)

Figure 5A:
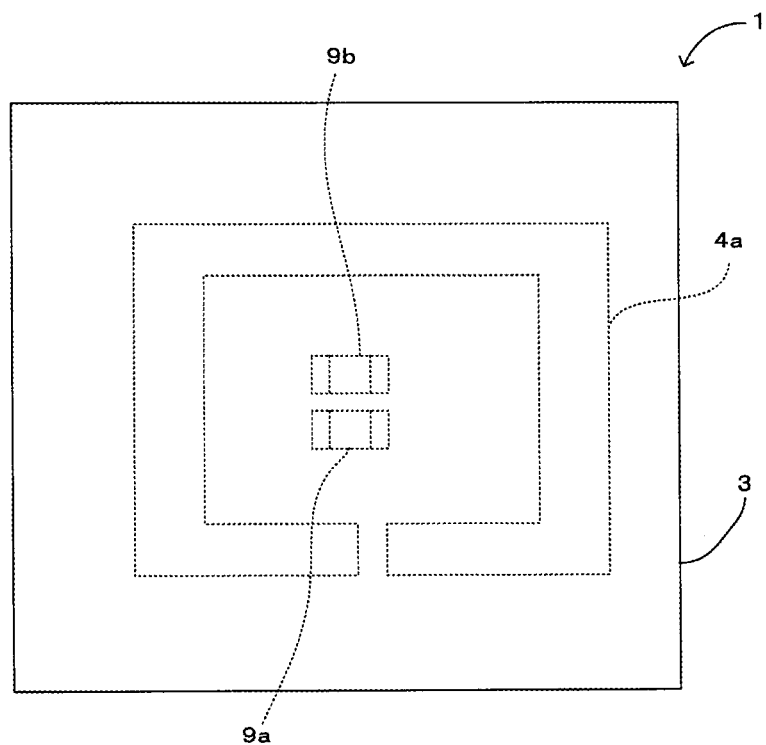
FIGS. 5A and 5B are diagrams each illustrating a modification of a coil core.
Figure 5B:
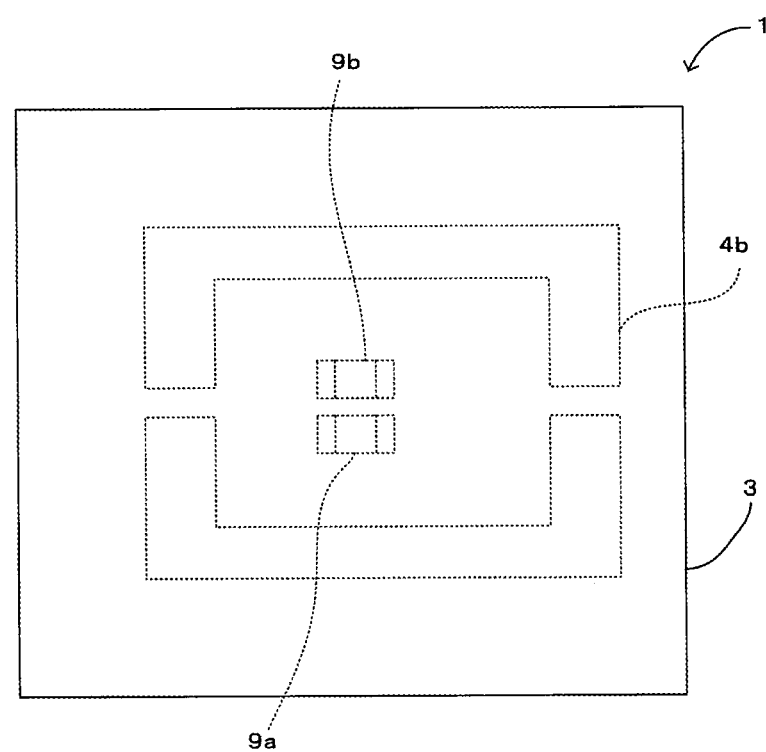
Figure 6:
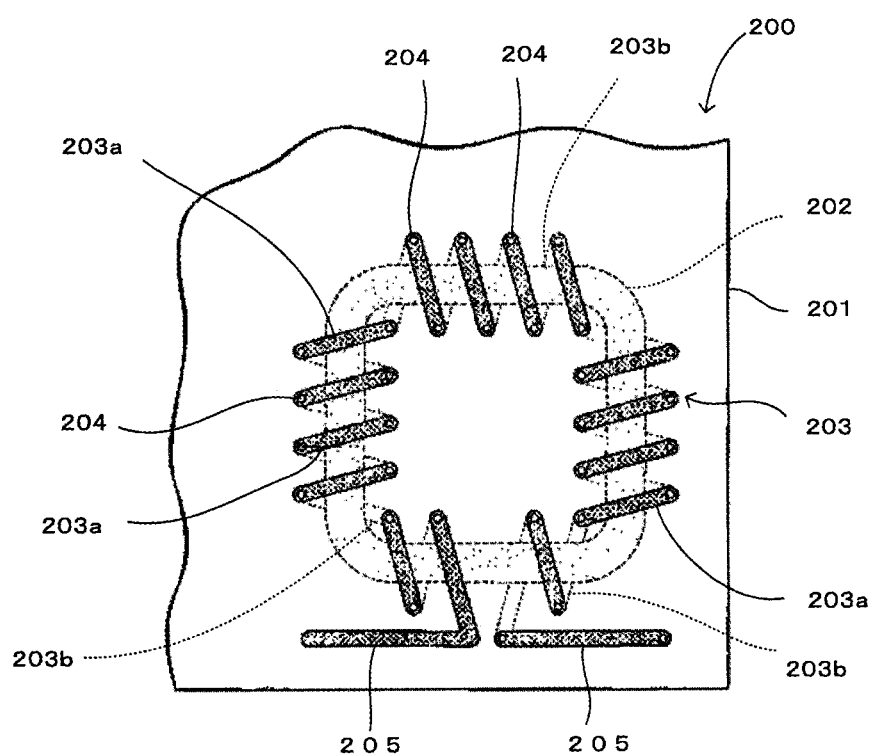
FIG. 6 is a plan view of a module of the related art.

A modification of the shape of the coil core 4 will now be described with reference to FIGS. 5A and 5B. FIG. 5A and FIG. 5B are plan views of the module each illustrating a modification of the coil core. In FIG. 5A and FIG. 5B, only the insulating layer, the electronic components disposed inside the insulating layer, and the coil core are illustrated, and other components are not illustrated.

In the above-described embodiment, although a case has been described in which the coil core 4 is formed in a ring-like shape, the shape of the coil core 4 may be suitably changed to any shape as long as the shape surrounds the predetermined region. For example, as illustrated in FIG. 5A, a coil core 4a may have a rectangular loop shape a portion of which is cut away when viewed in plan view. Alternatively, as illustrated in FIG. 5B, a coil core 4b may have a rectangular loop shape two portions of which are cut away when viewed in plan view.

Note that the present disclosure is not limited to the above-described embodiments, and various changes other than those described above can also be made within the scope of the present disclosure. For example, the insulating layer 3 may be made of, for example, a ceramic material.

In addition, in the above-described embodiments, although a case has been described in which a DC-DC converter is formed of the module 1, a component that is different from a DC-DC converter may be formed of the module 1 as long as the component is configured to include a coil formed of the coil core 4, 4a, or 4b and the coil electrode 5 and other electronic components.

Each of the electronic components 9a and 9b, which are disposed in the inner region (predetermined region) surrounded by the coil core 4, is not limited to a chip capacitor and can be suitably changed to, for example, in accordance with the configurations of the electronic components included in the module, a chip inductor, a chip resistor, an IC, a connector, or the like as long as each of the electronic components 9a and 9b can be disposed in an empty space of the inner region surrounded by the coil core 4.

In addition, in the above-described embodiments, all the electronic components 9a to 9c may be disposed in the insulating layer 3. In this case, the electronic component 9c, which is to be mounted on or in the top surface of the wiring board 2, may be disposed on the outer side (the outer periphery side) of the coil core 4 when viewed in plan view. As a result, the area of the module 1 when viewed in plan view can be further reduced compared with the case where all the electronic components 9a to 9c are disposed on the outer side of the coil core 4 when viewed in plan view.

In addition, another electronic component may be mounted on or in the bottom surface (the main surface located on the side opposite to the side on which the wiring board 2 is disposed) of the insulating layer 3.

INDUSTRIAL APPLICABILITY

The present invention can be widely applied to various modules each of which includes a wiring board, an insulating layer in which a coil core is embedded, a coil electrode that is wound around the coil core, and an electronic component.

REFERENCE SIGNS LIST

1 module
2 wiring board
3 insulating layer
4, 4a, 4b coil core
5 coil electrode
6a inner metallic pin (inner conductor)
6b outer metallic pin (outer conductor)
7 upper wiring pattern (second wiring pattern)
8 lower wiring pattern (first wiring pattern)
9a, 9b electronic component (first electronic component)
9c electronic component (second electronic component)

The invention claimed is:

1. A module comprising:
a wiring board;
an insulating layer that is laminated on a first main surface of the wiring board;
a coil core that is embedded in and surrounded by the insulating layer so as to surround a predetermined region wherein the insulating layer contacts each side of the coil core;
a coil electrode that is wound around the coil core;
a first electronic component that is disposed in the predetermined region of the insulating layer; and
a second electronic component that is mounted on or in a second main surface of the wiring board,
wherein the first electronic component is mounted on or in the first main surface of the wiring board, and
wherein a height of the first electronic component from the first main surface of the wiring board is larger than a height of the second electronic component from the second main surface of the wiring board and the height of the first electronic component from the first main surface of the wiring board is not larger than a height of the coil core from the first main surface of the wiring board.

2. The module according to claim 1,
wherein the coil core comprises a ring shape.

3. The module according to claim 1,
wherein the coil core comprises a partially cut-away ring shape.

4. The module according to claim 1,
wherein the coil electrode includes:
a plurality of first wiring patterns each of which has a first end that is located on an inner side of the coil core and a second end that is located on an outer side of the coil core, the plurality of first wiring patterns being arranged along a winding axis direction of the coil electrode on a first main surface of the insulating layer, which is a main surface located on a side opposite to a side on which the wiring board is disposed,
a plurality of second wiring patterns each of which has a first end that is located on the inner side of the coil core and a second end that is located on the outer side of the coil core, the plurality of second wiring patterns being arranged, so as to be paired with the first wiring patterns, along the winding axis direction of the coil electrode on a second main surface of the insulating layer, which is a main surface located on the side on which the wiring board is disposed,
a plurality of inner conductors that are disposed on the inner side of the coil core and each of which connects the first end of one of the first wiring patterns and the first end of one of the second wiring patterns, the second wiring pattern being paired with the first wiring pattern, and
a plurality of outer conductors that are disposed on the outer side of the coil core and each of which connects the second end of one of the first wiring patterns and the second end of one of the second wiring patterns, the second end of the first wiring pattern being connected to the second end of the second wiring pattern that is next to the second wiring pattern paired with the first wiring pattern,
wherein each of the inner conductors and the outer conductors comprises a metallic pin.

5. The module according to claim 2,
wherein the coil electrode includes:
a plurality of first wiring patterns each of which has a first end that is located on an inner side of the coil core and a second end that is located on an outer side of the coil core, the plurality of first wiring patterns being arranged along a winding axis direction of the coil electrode on a first main surface of the insulating layer, which is a main surface located on a side opposite to a side on which the wiring board is disposed,
a plurality of second wiring patterns each of which has a first end that is located on the inner side of the coil core and a second end that is located on the outer side of the coil core, the plurality of second wiring patterns being arranged, so as to be paired with the first wiring patterns, along the winding axis direction of the coil electrode on a second main surface of the insulating layer, which is a main surface located on the side on which the wiring board is disposed,
a plurality of inner conductors that are disposed on the inner side of the coil core and each of which connects the first end of one of the first wiring patterns and the first end of one of the second wiring patterns, the second wiring pattern being paired with the first wiring pattern, and
a plurality of outer conductors that are disposed on the outer side of the coil core and each of which connects the second end of one of the first wiring patterns and the second end of one of the second wiring patterns, the second end of the first wiring pattern being connected to the second end of the second wiring pattern that is next to the second wiring pattern paired with the first wiring pattern,
wherein each of the inner conductors and the outer conductors comprises a metallic pin.

6. The module according to claim 3,
wherein the coil electrode includes:
a plurality of first wiring patterns each of which has a first end that is located on an inner side of the coil core and a second end that is located on an outer side of the coil core, the plurality of first wiring patterns being arranged along a winding axis direction of the coil electrode on a first main surface of the insulating layer, which is a main surface located on a side opposite to a side on which the wiring board is disposed, a plurality of second wiring patterns each of which has a first end that is located on the inner side of the coil core and a second end that is located on the outer side of the coil core, the plurality of second wiring patterns being arranged, so as to be paired with the first wiring patterns, along the winding axis direction of the coil electrode on a second main surface of the insulating layer, which is a main surface located on the side on which the wiring board is disposed, a plurality of inner conductors that are disposed on the inner side of the coil core and each of which connects the first end of one of the first wiring patterns and the first end of one of the second wiring patterns, the second wiring pattern being paired with the first wiring pattern, and a plurality of outer conductors that are disposed on the outer side of the coil core and each of which connects the second end of one of the first wiring patterns and the second end of one of the second wiring patterns, the second end of the first wiring pattern being connected to the second end of the second wiring pattern that is next to the second wiring pattern paired with the first wiring pattern, wherein each of the inner conductors and the outer conductors comprises a metallic pin.

* * * * *